United States Patent
Brooks et al.

(10) Patent No.: US 6,661,673 B2
(45) Date of Patent: Dec. 9, 2003

(54) CARD GUIDE

(75) Inventors: Michael Alan Brooks, Sacramento, CA (US); Sean Anthony Cerniglia, Cool, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/074,783

(22) Filed: Feb. 12, 2002

(65) Prior Publication Data

US 2003/0151903 A1 Aug. 14, 2003

(51) Int. Cl.[7] .............................. H05K 7/14; H05K 5/00
(52) U.S. Cl. ........................ 361/756; 361/741; 361/802; 361/796
(58) Field of Search ................................ 361/756, 796, 361/801, 802, 741, 788

(56) References Cited

U.S. PATENT DOCUMENTS

| | | | | |
|---|---|---|---|---|
| 3,723,823 A | * | 3/1973 | Lit et al. ................. | 317/101 |
| 4,328,898 A | * | 5/1982 | Grassi ..................... | 211/41 |
| 4,750,088 A | * | 6/1988 | Friot ...................... | 361/384 |
| 4,861,277 A | * | 8/1989 | Bina ....................... | 439/377 |
| 5,331,517 A | * | 7/1994 | Walton et al. ............ | 361/796 |
| 5,594,627 A | * | 1/1997 | Le .......................... | 361/801 |
| 5,940,288 A | | 8/1999 | Kociecki ................. | 363/144 |
| 6,047,836 A | * | 4/2000 | Miles ..................... | 211/41.17 |
| 6,185,104 B1 | | 2/2001 | Obermaier .............. | 361/759 |
| 6,190,204 B1 | | 2/2001 | Huang .................... | 439/607 |
| 6,195,262 B1 | * | 2/2001 | Bodette et al. .......... | 361/752 |
| 6,198,633 B1 | | 3/2001 | Lehman et al. .......... | 361/756 |
| 6,229,709 B1 | | 5/2001 | Hardt et al. ............. | 361/753 |
| 6,269,006 B1 | | 7/2001 | Treiber et al. ........... | 361/756 |
| 6,320,760 B1 | | 11/2001 | Flamm et al. ........... | 361/801 |
| 6,377,470 B1 | * | 4/2002 | Hayward et al. ........ | 361/796 |
| 6,381,147 B1 | * | 4/2002 | Hayward et al. | |

OTHER PUBLICATIONS

The Handbook of Chemistry and Physics, CRC, 81st Edition, pp. 15–29, 4–129.*
"Steatite Group/Compact PCT Specification"; Lanner Electronics Inc.; http://www.steatite.co.uk/systems/compact.htm,;Steatite Group Limited, Kettles Wood Drive, Woodgate Business Park, Birmingham, B32 3DA, United Kingdom; 15 pgs.; Dec. 19, 2001.
"Dot Ten Component Guide"; A PW Electronic Solutions; http://wwww.apw.com/contact/; APW, N22 W23685 Ridgeview Parkway West, Waukesha, WI 53188–1013; USA; 13 pgs.; Dec. 19, 2001.
"Ripac Subrack and MPS Solutions for Compact PCI for Applications"; Rittal Corporation.; http://www.rittal–corp.com/; Rittal Corporation, 1 Rittal Place, Springfield, IL 45504; USA; 16 pgs.; Dec. 19, 2001.
"Rittal Rinet"; Rittal Corporation; http://www .enclosureinfo.com/tech/rittal/ovr/w rldloc_new .cfm?sitename= corp; Rittal Corporation, 1 Rittal Place, Springfield, Ohio 45504; USA; 9 pgs.; Dec. 19, 2001.

(List continued on next page.)

Primary Examiner—David Martin
Assistant Examiner—Dameon E. Levi

(57) ABSTRACT

An apparatus in one example comprises a first card guide base portion and a card guide end portion. The first card guide base portion is connected with a second card guide base portion in a side-by-side relationship. The card guide end portion is employable with the first card guide base portion to comprise one or more portions of a card guide path. The card guide end portion comprises a face of a color that is different from a color of the first card guide base portion.

58 Claims, 3 Drawing Sheets

OTHER PUBLICATIONS

"Smart New Value–Packed Innovations for CompactPCI Packaging Solutions"; Rittal Corporation.; http://www.rittal–corp.com/; Rittal Corporation, 1 Rittal Place, Springfield, Ohio 45504; USA; 20 pgs.; Dec. 19, 2001.

"CompactPCI"; PCI Industrial Computer Manufactorers Group; http://www.picmg.com/compactpci.stm; PICM G, c/o Virtual, Inc., 401 Edgewater Place, Suite 500, Wakefield, MA 01880; USA; 3 pgs.; Dec. 18, 2001.

"CPCI Card Guides" Bivar, Inc.; http://www.bivar.com/cpci/products/cpci_cardguides.htm; Bivar, Inc., 4 Thomas Irvine, CA 92618; USA; 2 pgs.; Oct. 31, 2001.

"HP Blade Servers"; http://www.hp.com; Hewlett–Packard, 3000 Hanover Street, Palo Alto, CA 94304–1185; USA; 8 pgs.; Dec. 19, 2001.

"Subracks/Card Cages"; APW; http://www .apw .com; APW, N22 W23685 Ridgeview Parkway West, Waukesha, WI 53188–1013; USA; 3 pgs.; Dec. 19, 2001.

"Technology Focus";www .hybricon.com; Hybricon Corporation, 12 Willow Road, Ayer, MA 01432; USA; 11 pgs.; Dec. 28, 2001.

"CompactPCI Specification Short Form"; http://www .picmg.org; PCI Industrial Computers Manufacturers Group; Rogers Communications, 301 Edgewater Place, Suie 220, Wakefield, MA 01880; USA; 8 pgs.

"EMC Front Panels"; www .elma.com; ELMA Electronic Inc., 44350 Grimmer Blvd., Fremont, CA 94538; USA; 11 pgs.; Jan. 16, 2002.

"Enclosure Products Accessories"; www .128.121.239.137/products/systems/enclosures/accessories.htm; ELMA Electronic Inc., 44350 Grimmer Blvd., Fremont, CA 94538; USA; 12 pgs.; Jan. 16, 2002.

"CompactPCI Specification"; PCI Industrial Computer Manufacturers Group; PICM G 2.0 Revision 3.0, section 4.1.10, Oct. 1, 1999, www .picmg.com; PICM G, c/o Virtual, Inc., 401 Edgewater Place, Suite 500, Wakefield, MA 01880; USA; 6 pgs.; Oct. 1, 1999.

"chassis"; http://www.techweb.com/encyclopedia/defineterm.yb?term= CompactPCTI; TechEncyclopedia; Computer Language Company, 5521 State Park Road, Point Pleasant, PA 18950; Jan. 2, 2001.

"chassis"; http://www.dictionary.com/cgi–bin/dict.pl?term= chassis; Dictionary.com; The American Heritage Dictionary of the English Language, Fourth Edition; Houghton Mifflin Company, Lexico, LLC, Los Angeles, CA; Jan. 2, 2002.

"PCI"; TechEncyclopedia; http://www .techweb.com/encyclopedia/defineterm.yb?term= CompactPCI; TechEncyclopedia; Computer Language Company, 5521 State Park Road, Point Pleasant, PA 18950; Jan. 2, 2002.

"compactPCI"; http://www .techweb.com/encyclopedia/defineterm.yb?term= CompactPCI; TechEncyclopedia; Computer Language Company, 5521 State Park Road, Point Pleasant, PA 18950; Dec. 18, 2001.

"0.100–inch Dot Ten Offset Card Guide"; A PW Electronic Solutions; http://www .apw .com/productsServices/productShow case/raptor765.jsp; A PW, N22 W23685 Ridgeview Parkway West, Waukesha, WI, 53188–1013; USA; 2 pgs.; Oct. 31, 2001.

"eurocard"; http://www .techweb.com/encyclopedia/defineterm.yb?term= CompactPCI; TechEncyclopedia; Computer Language Company, 5521 State Park Road, Point Pleasant, PA 18950; Dec. 18, 2001.

"backplane"; TechEncyclopedia; http://www .techweb.com/encyclopedia/defineterm.yb?term= CompactPCI; TechEncyclopedia; Computer Language Company, 5521 State Park Road, Point Pleasant, PA 18950; Jan. 2, 2002.

"printed circuit board"; TechEncyclopedia; http://www .techweb.com/encyclopedia/defineterm.yb?term= CompactPCI; TechEncyclopedia; Computer Language Company, 5521 State Park Road, Point Pleasant, PA 18950; 4 pgs.; Jan. 2, 2002.

\* cited by examiner

CARD GUIDE

BACKGROUND

A card guide is located in a chassis. The card guide includes rails for receiving blades or cards. Examples of card guides include single-slot card guides that include a single pair of rails, and multi-slot or ganged card guides that include multiple pairs of rails.

A color of the card guide in one example indicates a type of a card that the card guide should receive. Under the CompactPCI® core Specification available from PCI ("Peripheral Component Interconnect") Industrial Computer Manufacturers Group ("PICMG," c/o Virtual, Inc., 401 Edgewater Place, Suite 500, Wakefield, Mass. 01880, U.S.A., PICMG 2.0 Revision 3.0, section 4.1.10, Oct. 1, 1999, www.picmg.com), the card guide rails should be colored red to indicate a system slot, and the card guide rails should be colored non-red to indicate a peripheral or non-system slot.

Changing a color of all or part of a card guide that is located in a chassis in one example requires removal of the card guide from the chassis.

DESCRIPTION OF THE DRAWINGS

Features of exemplary implementations of the invention will become apparent from the description, the claims, and the accompanying drawings in which:

DETAILED DESCRIPTION

Figure 1:
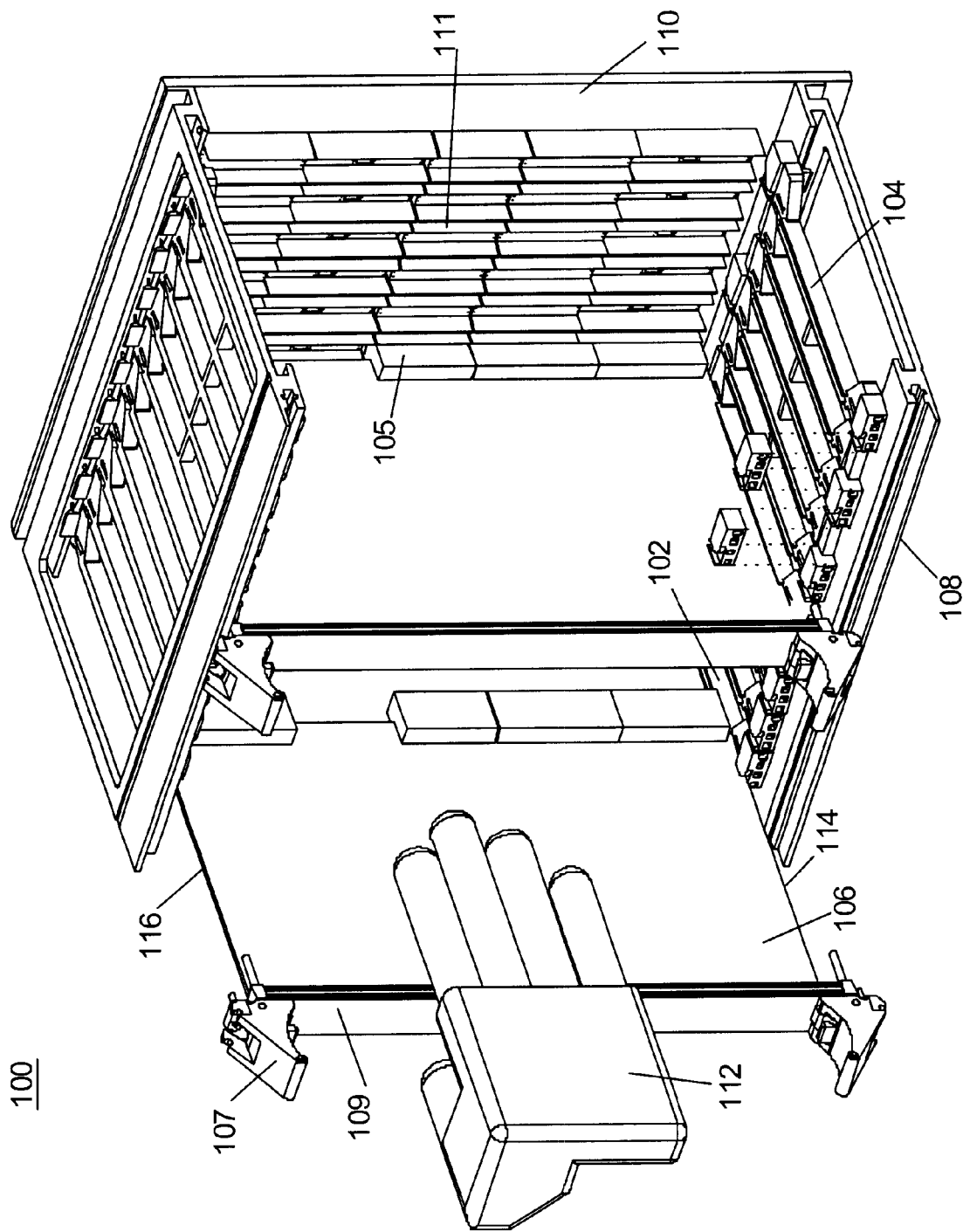
FIG. 1 is a representation of exemplary implementations of a card guide that are located in a chassis and receive one or more cards for coupling with a backplane.

Turning to FIG. 1, an apparatus 100 in one example comprises a first card guide base portion connected with a second card guide base portion in a side-by-side relationship. The apparatus 100 further comprises a card guide end portion employable with the first card guide base portion to comprise one or more portions of a card guide path. The card guide end portion comprises a face of a color that is different from a color of the first card guide base portion. As will be appreciated by those skilled in the art, a portion of a component of the apparatus 100 in one example comprises all of the component, and in another example comprises a subpart of the component, where the subpart of the component comprises less than all of the component.

Referring still to FIG. 1, in one example, the apparatus 100 includes card guides 102 and 104, blades or cards 106, attachment components 107, structural members 109, a chassis 108, and a backplane 110. The card guides 102 and 104 comprise paths 201 (FIG. 2) and 301 (FIG. 3) that serve to receive, guide, and support the cards 106 for insertion and connection to the backplane 110, for example, by a user (e.g., a human operator) 112. When the card guide 102 or 104 receives the card 106, the card guide 102 or 104 bears whatever weight or force of the card 106 falls or is exerted upon or against the card guide 102 or 104. The apparatus 100 in one example comprises any (e.g., horizontal, oblique, or vertical) orientation, with the description and figures herein illustrating one exemplary orientation of the apparatus 100 for explanatory purposes.

Again referring to FIG. 1, the card 106 in one example comprises a printed circuit board ("PCB"). The backplane 110 in one example comprises an interconnecting device. For example, the cards 106 comprise connector components 105 and the backplane 110 comprises slots 111. The connector components 105 of the card 106 in one example plug into the slots 111 of the backplane 110. For example, the user 112 physically manipulates the cards 106 to cause the connector components 105 to enter the slots 111 for electrical and mechanical coupling of the cards 106 with the backplane 110.

Still referring to FIG. 1, the attachment components 107 in one example comprise a latch and/or lever system that allows for positioning of the cards 106. In addition, the structural member 109 in one example comprises a bulkhead that is attached to the card 106. Further, the chassis 108 in one example comprises a framework to which are attached components of electronic equipment.

Referring again to FIG. 1, the attachment components 107 in one example comprise levers (e.g., a pair of mirror-image handles) that are attached to the structural member 109. In a further example, the attachment components 107 comprise teeth for engagement with the chassis 108. In a still further example, the attachment components 107 comprise lock devices that serve to secure the card 106 in position, as will be appreciated by those skilled in the art.

Figure 2:
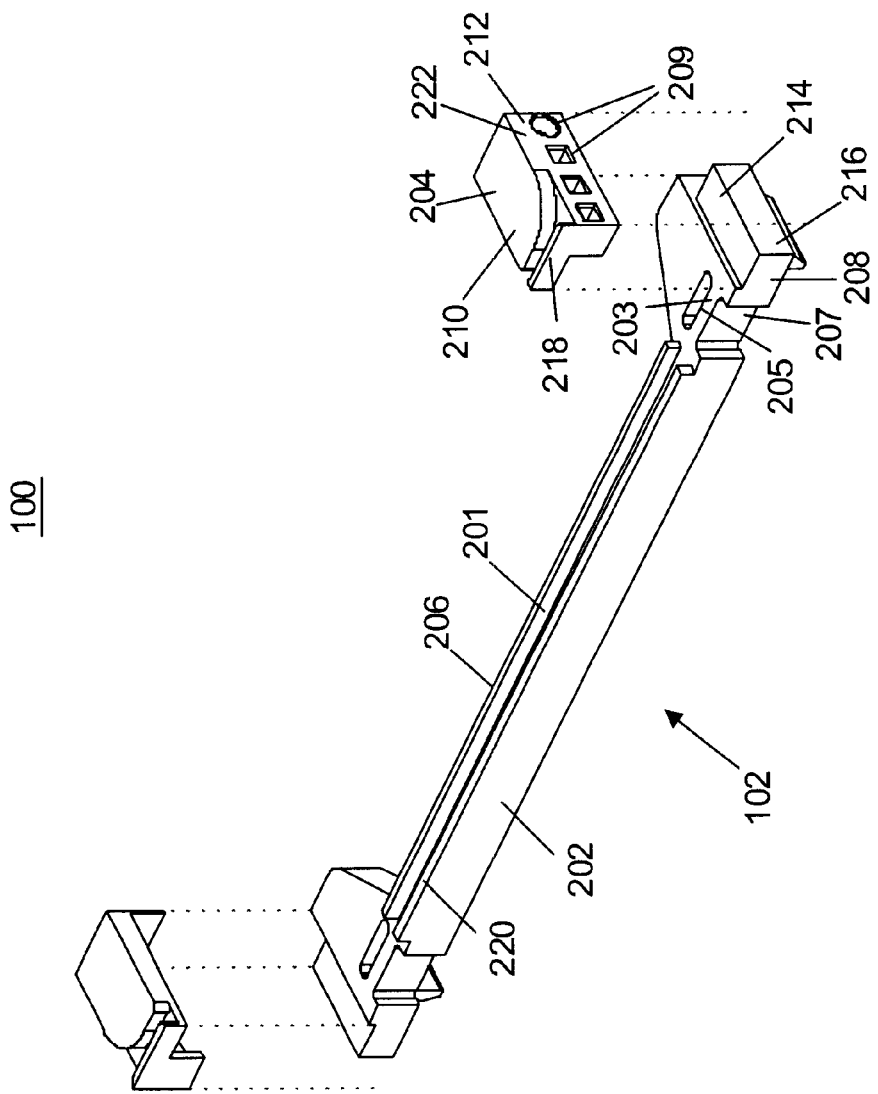
FIG. 2 is a representation of one exemplary implementation of the card guide of FIG. 1.

Turning to FIG. 2, the card guide 102 comprises a card guide base 202, one or more card guide ends 204, and a set of card guide rails 206. In one example, a set of the card guide rails 206 comprises a (e.g., plural) number of the card guide rails 206 that cooperate to receive and guide the card 106 (FIG. 1) in the path 201. For example, the set of the card guide rails 206 comprises a pair of the card guide rails 206.

Referring still to FIG. 2, the card guide base 202 comprises base ends 208. The base end 208 in one example comprises a land 203, for example, between recesses 205 and 207. The recess 205 in one example comprises an opening and/or a hole. The recess 207 in one example comprises an indentation and/or a hole. The land 203 and the recesses 205 and 207 in one example comprise a clip cutout. The clip cutout in one example serves to receive a clip (not shown), for example, an electrostatic discharge ("ESD") clip. In one example, the clip (not shown) comprises a face and/or guide rails that are employable with a subpart 218 of one or more of the card guide ends 204 and a subpart 220 of the card guide base 202 to comprise (e.g., a portion of) the path 201 and/or the card guide rails 206, as will be appreciated by those skilled in the art.

Again referring to FIG. 2, each of the base ends 208 in one example comprises a mirror image of the other one of the base ends 208. In one example, each of the base ends 208 is capable of receiving a respective one of the card guide ends 204. The card guide ends 204 in one example are available in two configurations, where each configuration comprises a mirror image of the other one of the configurations. In another example, the card guide ends 204 are available in more than two configurations, for example, multiple sets of configurations comprising different pairs of mirror-image configurations.

Referring to FIGS. 1–2, in one example, the mirror-image configuration of the card guide ends 204 and the base ends 208 serves to allow either of the base ends 208, and optionally a matched one of card guide ends 204, to be located closer to the backplane 110, while the other of the base ends 208, and a matched one of the card guide ends 204, is located further from the backplane 110 and closer to the user 112. In one example, the card guide end 204 and the base end 208 are matched when the card guide end 204 and the base end 208 comprise compatible structures, for example, structures of the same general orientation. For example, the matched ones of the card guide end 204 and the base end 208 resemble each other more than either would resemble the mirror-image configuration of the other.

In a further example, referring to FIGS. 1–2, the base end 208 located closer to the backplane 110 omits all of the card guide ends 204, so that base end 208 itself comprises the end of the card guide 102 located closer to the backplane 110. In a still further example, the base end 208 when located closer to the backplane 110 initially omits any card guide end 204 and the card guide path 201 of the card guide 102 receives a first longitudinal edge 114 of the card 106, and in another arrangement (e.g., with the base end 208 rotated one hundred eighty degrees about its longitudinal axis as well as reversed in its positioning relative to the chassis 108) that base end 208 is then located closer to the user 112 and has a matched one of the card guide ends 204 disposed thereon and the card guide path 201 of the card guide 102 receives a second longitudinal edge 116 of the card 106.

In yet another example, referring to FIGS. 1–2, the base end 208 does have the card guide end 204 disposed thereon when located closer to the backplane 110. For example, with the card guide end 204 disposed on the base end 208 that is located closer to the blackplane 110, the card guide path 201 of the card guide 102 receives the first longitudinal edge 114 of the card 106, and in another arrangement with the base end 208 with the card guide end 204 thereon located closer to the user 112, the card guide path 201 of the card guide 102 receives the second longitudinal edge 116 of the card 106.

Again referring to FIG. 2, the card guide end 204 in one example comprises a card guide attachment component or a card guide insert. In addition, the card guide end 204 may be attached to the card guide base 202 in various ways. For example, the card guide end 204 may be removably, replaceably, securely, or permanently attached to the card guide base 202. Exemplary attachment of the card guide end 204 to the card guide base 202 employs mechanical latching, plastic riveting, ultrasonic welding, adhesive attachment, or interference fitting.

Referring still to FIG. 2, the card guide end 204 in one example comprises one or more recesses 209. The recesses 209 in one example comprise one or more openings and/or holes. For example, referring to FIGS. 1–2, the recess 209 serves to restrict the use of a particular one of the slots 111 to only a specific one of the cards 106 that should be plugged into the slot 111. In one example, the recesses 209 facilitate a keying system, for example, through intentional filling and leaving unfilled of specific ones of the recesses 209. For example, different combinations of filled and unfilled ones of the recesses 209 serve to prevent damage to apparatus 100 by promoting avoidance of loading of non-complementary ones of the cards 106 in restricted ones of the card guide paths 201, as will be appreciated by those skilled in the art.

Referring further to FIG. 2, the card guide end 204 comprises legs 210 and 212 that extend in different directions. For example, the legs 210 and 212 are (e.g., generally) orthogonal to each other. The base end 208 comprises a body face 214 and an end face 216. The body face 214 in one example serves to receive the leg 210. The end face 216 in one example serves to receive the leg 212. In a further example, the body face 214 and the end face 216 serve as end faces of the card guide path 201 without the presence of any of the card guide ends 204 at the base end 208, for example, when that base end 208 is located close to the backplane 110.

Still referring to FIG. 2, the leg 210 comprises the subpart 218 of the guide rails 206. The card guide base 202 comprises the subpart 220 of the guide rails 206. For example, referring to FIGS. 1–2, the guide rails 206 of the card guide path 201 of a first card guide 102 supported by the chassis 108 receive the first longitudinal edge 114 of the card 106, and the guide rails 206 of the card guide path 201 of a second card guide 102 supported by the chassis 108 receive the second longitudinal edge 116 of the card 106.

In one example, referring to FIG. 2, the guide rails 206 comprise the subpart 218 of the leg 210 of a single card guide end 204 aligned with the subpart 220 of the card guide base 202 and aligned with guide rails of a clip (not shown) disposed on the land 203, where the single card guide end 204 is disposed on the base end 208 that is located further from the backplane 110 and closer to the user 112. In another example, the guide rails 206 comprise the subparts 218 of each of the legs 210 of the pair card guide ends 204 aligned with the subpart 220 of the card guide base 202 and aligned with guide rails of a pair of clips (not shown) disposed on the lands 203, where each of the card guide ends 204 is disposed on one of the base ends 208.

Referring to FIGS. 1–2, the leg 212 comprises a face 222 that is available for viewing by the user 112. The color of the face 222 is indicative of a slot capability that corresponds to the type of the card 106 that should be guided by the card guide path 201 of the card guide 102. For example, the slot capability represents a capability that the card 106 should have in order to be plugged into the slot 111 to which the card guide path 201 of the card guide 102 guides the card 106.

Still referring to FIGS. 1–2, in one example, a red color of the face 222 serves to indicate a system slot capability. In another example, a non-red color of the face 222 serves to indicate a peripheral or non-system slot capability. Examples of non-red colors include neutral colors, for example, beige or gray. In yet another example, a specific non-red (e.g., orange, yellow, green, blue, black, or white) color of the face 222 is indicative of a respective non-system (e.g., switch, storage, or management) slot capability that corresponds to the particular card 106 that should be guided by the card guide path 201 of the card guide 102.

Referring again to FIGS. 1–2, the face 222 of the card guide end 204 and the remainder of the card guide end 204 in one example share a substantially same and/or uniform color. In a further example, conspicuously different colors (e.g., red, orange, yellow, green, blue, black, or white) of the faces 222 of different card guide ends 204 serve to indicate different (e.g., system, switch, storage, or management) slot capabilities. For example, the user 112 employs (e.g., selects or chooses) the conspicuously different colors for the card guide ends 204 to indicate different slot capabilities among the different card guide paths 201 of the card guides 102 contemporaneously or over time, and/or to indicate different slot capabilities of a single card guide path 201 of the card guide 102 at different times, such as by switching or replacing the card guide ends 204 disposed on the base ends 208 located further from the backplane 110 and closer to the user 112.

Referring still to FIGS. 1–2, the card guide base 202 of the card guide paths 201 of the card guide 102 in one example is preformed with a color, and the user 112 selects the color of the card guide end 204 for the card guide paths 201 of the card guide 102 subsequent to the predetermination of the color of the card guide base 202. For example, the user 112 selects the color of the card guide end 204 to indicate the (e.g., system or non-system) slot capability that corresponds to the card 106 that should be guided by the card guide path 201 of the card guide 102. The card guide base 202 in one example is not as available to the user 112 for viewing as is the face 222 of the card guide end 204. So, the color of the card guide end 204 that faces the user 112 is particularly indicative of the slot capability which corresponds to the type of the card 106 that should be guided by the card guide path 201 of the card guide 102.

Again referring to FIG. 2, notwithstanding that the color of the card guide end 204 facing the user 112 in one example indicates the slot capability for the type of the card 106, the color of the card guide base 202 in one example is non-indicative of the slot capability which corresponds to the type of the card 106 that should be guided by the card guide path 201 of the card guide 102. In a further example, the color of the card guide base 202 is non-indicative of any particular slot capability. In another example, the color of the card guide base 202 indicates a different slot capability than the slot capability that corresponds to the card 106 which should be guided by the card guide path 201 of the card guide 102. In yet another example, the (e.g., substantially) same color is shared by the card guide end 204 and the card guide base 202, where the color is indicative of the slot capability for the type of the card 106.

Referring further to FIGS. 1–2, in one example, the user 112 selects the color of the card guide end 204 to be different from the color of the card guide base 202, for example, where the card guide path 201 of the card guide 102 that comprises the card guide end 204 and the card guide base 202 is for guiding a card 106 that corresponds to a slot capability different from a slot capability indicated by the color of the card guide base 202. In another example, the user 112 selects the color of the card guide end 204 without regard to the color of the card guide base 202. In a further example, the user 112 changes the color of the card guide end 204 of the card guide path 201 of the card guide 102 by replacing the card guide end 204 of one color (e.g., a first color) with a card guide end 204 of a different color (e.g., a second color).

In yet another example, referring to FIGS. 1–2, the user 112 employs different colors for the card guide ends 204 disposed on each of the card guide bases 202, where the color of the card guide end 204 located further from the backplane 110 and closer to the user 112 is indicative of the slot capability of the card guide 102. For example, the user 112 switches the color of the card guide end 204 located further from the backplane 110 to correct or change an indication of the slot capability with little concern about the color of the optional card guide end 204 located closer to the backplane 110 and further from the user 112, since the color of the card guide end 204 closer to the user 112 in one example is highly viewable by the user 112 and, if employed, the card guide end 204 further from the user 112 in one example is minimally, if at all, viewable by the user 112 upon casual inspection.

Referring still to FIGS. 1–2, the user 112 in one example changes the color of the card guide end 204 disposed on the card guide end 208 that is closer to the user 112, without removing the card guide base 202 from the chassis 108. For example, the card guide ends 204 comprise inserts of different colors, and the user slips a card guide end 204 of one color off the card guide base 202 and slips another card guide end 204 of a different color on the card guide base 202 to comprise the card guide path 201 of the card guide 102.

Again referring to FIGS. 1–2, the card guide end 204 and the card guide base 202 in one example comprise different materials. The card guide base 202 in one example bears more of the load of, and/or provides more support to, the card 106 than does the card guide end 204, for example, during installation and/or removal of the card 106, and/or holding of the card 106 upon positioning of the card 106 within the chassis 108. So, the card guide end 204 in one example comprises a material of less load-bearing capability than a material that comprises the card guide base 202. In one example, the card guide end 204 comprises a material that is less expensive than the material that comprises the card guide base 202. For example, the card guide end 204 comprises a structure that is, or whose production tools (not shown) are, relatively simple and/or inexpensive to make and use. In a further example, the card guide end 204 comprises plastic and the card guide base 202 comprises a glass-infused plastic or a reinforced-acrylonitrile-butadiene-styrene ("ABS") plastic.

Figure 3:
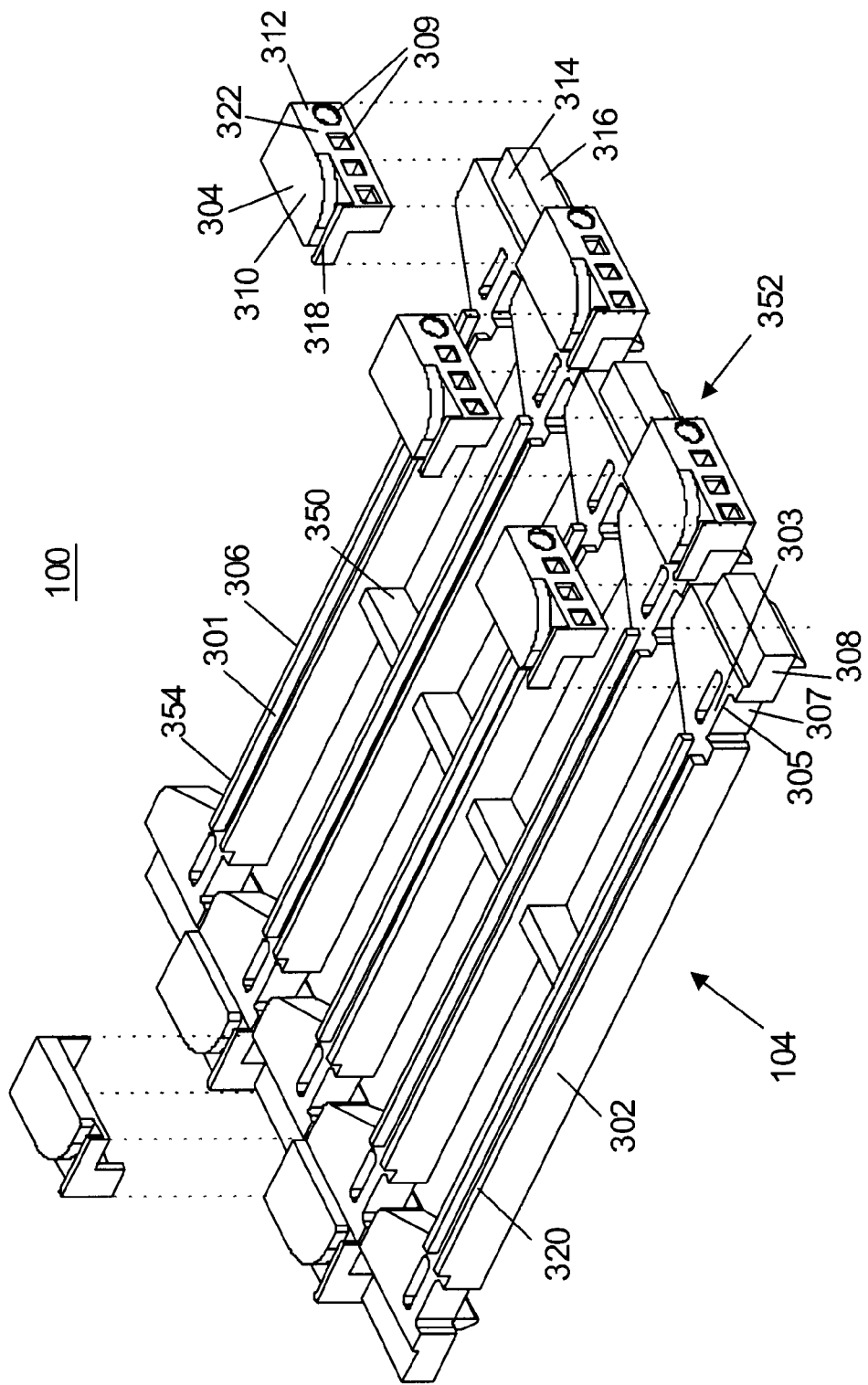
FIG. 3 is a representation of another exemplary implementation of the card guide of FIG. 1.

Now referring to FIGS. 2–3, the card guide 104 in one example resembles multiple interconnected or ganged ones of the card guides 102. In a further example, the card guide 104 comprises features analogous to those described herein with reference to the card guide 102, as well as additional features. For example, card guide paths 301, card guide bases 302, lands 303, card guide ends 304, recesses 305, card guide rails 306, recesses 307, base ends 308, recesses 309, legs 310, legs 312, body faces 314, end faces 316, subparts 318, subparts 320, and faces 322 of the card guides 104 are analogous to the card guide paths 201, the card guide bases 202, the lands 203, the card guide ends 204, the recesses 205, the card guide rails 206, the recesses 207, the base ends 208, the recesses 209, the legs 210, the legs 212, the body faces 214, the end faces 216, the subparts 218, the subparts 220, and the faces 222 of the card guides 102, respectively. In a further example, the card guide ends 204 and 304 are (e.g., substantially) the same. For example, corresponding mirror-image card guide ends 204 and 304 are interchangeable.

Referring to FIGS. 1 and 3, the card guide 104 in one example comprises a plurality of the card guide bases 302 connected in a side-by-side relationship. In addition, the card guide 104 in one example comprises a plurality of the card guide paths 301 arranged in the side-by-side relationship. The side-by-side relationship in one example comprises a series or row of the card guide bases 302 having major parts thereof aligned substantially in parallel, and a series or row of the card guide paths 301 aligned substantially in parallel. For example, the card guide bases 302 and the card guide paths 301 in the side-by-side relationship are arranged generally along a (e.g., horizontal, oblique, or vertical) plane that is substantially parallel with a plane along which a corresponding support member of the chassis 108 is generally disposed.

Still referring to FIGS. 1 and 3, each of the card guide bases 302 in one example is connected to one or more adjacent card guide bases 302 in the card guide 104. The adjacent card guide bases 302 in one example are (e.g., structurally) connected through employment of connecting members 350 between intermediate locations of the card guide bases 302 and/or interconnected (e.g., integrally-formed) surfaces 352 between adjacent base ends 308 of the card guide ends 304. The card guide bases 302 and the connecting members 350 and/or interconnected surfaces 352 in one example comprise a unitary construction 354 of the card guide 104. The unitary construction 354 in one example allows one to obtain multiple of the card guide bases 302 and/or portions of the card guide paths 301 from one iteration of a manufacturing process and/or tool.

The steps or operations described herein are just exemplary. There may be many variations to these steps or operations without departing from the spirit of the invention. For instance, the steps may be performed in a differing order, or steps may be added, deleted, or modified.

Although exemplary implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. An apparatus, comprising:
   a first card guide base portion;
   a second card guide base portion;
   a connecting member that serves to connect the first and second card guide base portions and cause the first and second card guide base portions to comprise a side-by-side relationsbip component engageable with a chassis;
   wherein the first card guide base portion, the second card guide base portion, and the connecting member comprise an integral formation; and
   a card guide end portion employable with the first card guide base portion to comprise one or more portions of a card guide path;
   the card guide end portion detachably connectable with the first card guide base portion contemporaneously with engagement of the first card guide base portion with the chassis; and
   at least a majority of the card guide end portion comprising a color that is different from a color of the first card guide base portion.

2. The apparatus of claim 1, wherein the face of the card guide end portion comprises a color that is different from a color that comprises the first card guide base portion.

3. The apparatus of claim 1, wherein the first card guide base portion comprises a first guide rails subpart, wherein the card guide end portion comprises a second guide rails subpart, wherein the first guide rails subpart is employable wit the second guide rails subpart to comprise one or more portions of a guide rails set of the card guide path.

4. The apparatus of claim 3, wherein the second card guide base portion comprises a third guide rails subpart the apparatus fUrther comprising:
   a second card guide end portion that comprises a fourth guide rails subpart, wherein the third guide rails subpart is employable with the fourth guide rails subpart to comprise one or more portions of a guide rails set of a second card guide pat.

5. The apparatus of claim 4, wherein the second card guide end portion comprises a face of a color that is different from a color of the second card guide base portion.

6. The apparatus of claim 1, wherein the card guide end portion comprises a first card guide end portion, the apparatus further comprising:
   a second card guide end portion employable with the second card guide base portion to comprise one or more portions of a second card guide path, wherein the second card guide end portion comprises a flice of a color that is different from a color of the second card guide base portion.

7. The apparatus of claim 6, wherein the face of the first card guide end portion comprises a color that is different from a color that comprises the first card guide base portion;
   wherein the face of the second card guide end portion comprises a color that is different from a color that comprises the second card guide base portion;
   wherein a substantially same color comprises the first card guide base portion and the second card guide base portion.

8. The apparatus of claim 7, wherein the color that comprises the face of to first card guide end portion and the color that comprises the face of the second card guide end portion are selectable to comprise any one of a substantially same color and a different color.

9. The apparatus of claim 1, wherein the side-by-side relationship component and the connecting member comprise a unitary construction.

10. The apparatus of claim 1, wherein the side-by-side relationship component, the connecting member, and the card guide end portion comprise a card guide;
    wherein the face is available for viewing by a user when the card guide is located in the chassis and a card is located in the card guide path.

11. An apparatus, comprising:
    a first card guide base portion connected with a second card guide base portion in a side-by-side relationship; and
    a card guide end portion employable with the first card guide base portion to comprise one or more portions of a card guide path;
    at least a majority of the card guide end portion comprising a color that is different from a color of the first card guide base portion;
    wherein the color of the face is indicative of a type of card that should be guided by the card guide path, wherein the color of the first card guide base portion is non-indicative of the type of card;
    wherein the card guide end portion is detachably connectable with the first card guide base portion contemporaneously with engagement of the first card guide base portion with a chassis.

12. The apparatus of claim 11, wherein the color of the face is indicative of a system slot capability, wherein the color of the first card guide base portion is non-indicative of the system slot capability.

13. An apparatus, comprising:
    a first card guide base portion;
    a second card guide base portion;
    a connecting member that serves to connect the first and second card guide base portions and cause the first and second card guide base portions to comprise a side-by-side relationship component engageable wit a chassis;
    wherein the first card guide base portion, the second card guide base portion, and the connecting member comprise an integral formation; and
    a card guide end portion employable with the first card guide base portion to comprise one or more portions of a card guide path;
    the card guide end portion detachably connectable with the first card guide base portion contemporaneously with engagement of the first card guide base portion with the chassis;
    at least a majority of the card guide end portion comprising the color that is different from the color of the first card guide base portion;
    wherein the card guide end portion comprises a material that is different from a material of the first card guide base portion.

14. The apparatus of claim 13, wherein the material of the first card guide base portion comprises the first card guide base portion, wherein the material of the card guide end portion comprises less load-bearing capability than the material of the first card guide base portion.

15. The apparatus of claim 14, wherein the material of the card guide end portion comprises a load-bearing capability that is less than a load-bearing capability of the material of the first card guide base portion that is intended to support a card received in the card guide path.

16. The apparatus of claim 14, wherein the material that comprises the first card guide base portion and a material that comprises the second card guide base portion comprise a substantially same load-bearing capability.

17. The apparatus of claim 13, further comprising:
- a second card guide end portion employable with the second card guide base portion to comprise one or more portions of a second card guide path;
- wherein the second card guide end portion comprises a material that is different from a material of the second card guide base portion;
- wherein a substantially same material comprises the first card guide base portion and the second card guide base portion.

18. The apparatus of claim 13, wherein the material of the card guide end portion comprises plastic, wherein the material of the first card guide base portion comprises any one of a glass-infused plastic and a reinforced-acrylonitrile-butadiene-styrene plastic.

19. The apparatus of claim 13, wherein the side-by-side relationship component and the connecting member comprise a unitary construction.

20. An apparatus, comprising:
- a first preformed card guide base portion;
- a second preformed card guide base portion;
- a preformed connecting member that serves to connect the first and second preformed card guide base portions and cause the first and second preformed card guide base portions to comprise a preformed side-by-side relationship component engageable with a chassis;
- wherein the first preformed card guide base portion, the second preformed card guide base portion, and the preformed connecting member comprise an integral formation and
- a card guide end attachment component that is attachable with the first preformed card guide base portion to comprise one or more portions of a card guide path;
- the card guide end attachment component detachably connectable with the first preformed card guide base portion contemporaneously with engagement of the first preformed card guide base portion with the chassis; and
- at least a majority of the card guide end attachment component comprising the color that is different from the color of the first preformed card guide base portion.

21. The apparatus of claim 20, wherein the first preformed card guide base portion comprises a first guide rails subpart, wherein the card guide end attachment component comprises a second guide rails subpart, wherein the first guide rails subpart is employable with the second guide rails subpart to comprise one or more portions of a guide rails set of the card guide path.

22. The apparatus of claim 21, wherein the second preformed card guide base portion comprises a third guide rails subpart, the apparatus further comprising:
- a second card guide end attachment component that comprises a fourth guide rails subpart, wherein the third guide rails subpart is employable with the fourth guide rails subpart to comprise one or more portions of a guide rails set of a second card guide path.

23. The apparatus of claim 22, wherein the second card guide end attachment component comprises a face of a color that is different from a color of the second preformed card guide base portion.

24. The apparatus of claim 20, wherein the card guide end attachment component comprises a face of a color that is different from a color of the first preformed card guide base portion.

25. The apparatus of claim 20, wherein the preformed side-by-side relationship component and the preformed connecting member comprise a preformed unitary construction.

26. An apparatus, comprising:
- a card guide insert that comprises a first leg that extends in a first direction and a second leg that extends in a second direction; and
- a card guide base portion that comprises a base end portion that comprises an end face for receiving the first leg and a body face for receiving the second leg;
- the card guide insert having a first color that is different from a second color of the card guide base portion;
- wherein upon location of the card guide base portion in a chassis, location of the first leg on the end the, and location of the second leg on the body face, the base end portion serves to engage a portion of the chassis and one or more of the body face and the end face serve to support the card guide insert over the portion of the chassis;
- the card guide insert detachably connectable with the card guide base portion contemporaneously with engagement of the card guide base portion with the chassis.

27. The apparatus of claim 26, wherein the card guide insert comprises a first material of less load-bearing capability than a second material that comprises the card guide base portion.

28. The apparatus of claim 26, wherein the card guide base portion comprises a first card guide base portion, the apparatus further comprising:
- a second card guide base portion connected with the first card guide base portion in a side-by-side relationship component engageable with the chassis.

29. The apparatus of claim 28, wherein the card guide insert comprises a first card guide insert, and further comprising:
- a second card guide insert that comprises third and fourth legs that extend in different directions, wherein the second card guide base portion comprises a second base end portion that comprises a second end face for receiving the third leg and a second body face for receiving the fourth leg;
- wherein upon location of the second card guide base portion in the chassis, location of the third leg on the second end face, and location of the fourth leg on the second body face, the second base end portion serves to engage a second portion of the chassis and one or more of the second body face and the second end face serve to support the second card guide insert over the second portion of the chassis.

30. The apparatus of claim 29, wherein the first card guide base portion and the second card guide base portion comprise a unitary construction.

31. An apparatus, comprising:

means for changing a color of an end face portion of a card guide path in a chassis from a group of available colors without decoupling a base portion of the card guide path from the chassis, the means for changing having:

a first removable card guide end insert of a first color, wherein the first removable card guide end insert comprises the end face portion upon removable connection of the first removable card guide end insert with the base portion in the card guide path; and a second removable card guide end insert of a second color, wherein the second removable card guide end insert comprises the end face portion upon:

removal of the first removable card guide end insert from connection with the base portion in the card guide path; and removable connection of the second removable card guide end insert with the base portion in the card guide path.

32. The apparatus of claim 31, wherein the means for changing comprises:

means for employing a material for the end face portion that comprises less load-bearing capability than a material that comprises the base portion;

means for employing the end face portion with the base portion to comprise one or more portions of the card guide path; and means for employing the card guide path to receive a card.

33. The apparatus of claim 31, wherein the means for changing comprises:

means for employing conspicuously different colors for the end face portion to indicate a first slot capability at a first time and a second slot capability at a second time; and means for employing a substantially same color for to base portion at the first time and the second time.

34. The apparatus of claim 31, wherein the card guide path comprises a first card guide path, wherein the means for changing comprises:

means for employing a first color for the end face portion of the first card guide path to indicate a system slot capability; and means for employing a second color for an end face portion of a second card guide path to indicate a non-system slot capability.

35. The apparatus of claim 34, wherein the means for employing the second color for the end face portion of the second card guide path to indicate the non-system slot capability comprises:

means for employing the second color for the end face portion of the second card guide path to indicate a switch slot capability;

means for employing a third color for an end face portion of a third card guide path to indicate a storage slot capability; and means for employing a fourth color for an end face portion of a fourth card guide path to indicate a management slot capability.

36. The apparatus of claim 35, further comprising:

means for connecting the base portion of the first card guide path and respective base portions of the second, third, and fourth card guide paths in a side-by-side relationship component engageable with the chassis.

37. The apparatus of claim 35, further comprising:

means for employing a unitary construction of a side-by-side relationship component, engageable with the chassis, forte base portion of the first card guide path and a base portion of the second card guide path.

38. A method, comprising the steps of:

choosing a color firm a group of available colors for an end face portion of a card guide path as an indication of a capability of a card that should be guided by the card guide path and with an intention to employ the end face portion with a card guide base portion, that comprises a preselected color non-indicative of the capability of the card, to comprise one or more portions of the card guide path;

maintaining an engagement of the card guide base portion with a chassis contemporaneously with the step of choosing the color from the group of available colors for the end face portion of the card guide path;

maintaining the engagement of the card guide base portion with the chassis contemporaneously with a connecting of the end face portion with the card guide base portion; and changing the color in the group of available colors, as an indication of a second capability of a second card that should be guided by the card guide path, for the end face portion without decoupling the card guide base portion from the chassis.

39. A method, comprising the steps of:

choosing any one of a red colored card guide end face portion and a non-red colored card guide end face portion for employment wit a first preformed card guide base portion, that is connected by a preformed connecting member with a second preformed card guide base portion in a preformed side-by-side relationship component engageable with a chassis, to comprise a portion of a card guide path; and integrally forming the first preformed card guide base portion, the second preformed card guide base portion, and the preformed connecting member;

the any one of the red colored card guide end face portion and the non-red colored card guide end face portion detachably connectable with the first card guide base portion contemporaneously with engagement of the first card guide base portion with the chassis.

40. The method of claim 39, wherein the step of choosing the any one of the red colored card guide end face portion and the non-red colored card guide end face portion comprises the steps of:

choosing the red colored card guide end face portion when a type of card that should be guided by the card guide path corresponds to a system slot capability; and choosing the non-red colored card guide end face portion when the type of card that should be guided by the card guide path corresponds to a non-system slot capability.

41. The apparatus of claim 1, wherein first card guide base portion comprises a first intermediate location along the first card guide base portion;

wherein the second card guide base portion comprises a second intermediate location along the second card guide base portion;

wherein to connecting member serves to connect the first and second intermediate locations to cause the first and second card guide base portions to comprise the side-by-side relationship component engageable with the chassis.

42. The apparatus of claim 26, wherein the card guide insert is any one or more of removable and replaceable with respect to the card guide base portion contemporaneously with engagement of the base portion with the chassis.

43. The apparatus of claim 28, further comprising:
a connecting member that serves to connect the first and second card guide base portions and cause the first and second card guide base portions to comprise the side-by-side relationship component.

44. The apparatus of claim 43, wherein the side-by-side relationship component and the connecting member comprise a unitary construction.

45. The method of claim 38, further comprising the steps of:
connecting the end face portion with the card guide base portion; and
maintaining the engagement of the card guide base portion with the chassis contemporaneously with the step of connecting the end face portion with the card guide base portion.

46. The apparatus of claim 1, wherein the card guide end portion comprises one or more recesses to facilitate a keying system.

47. The apparatus of claim 1, wherein the integral formation facilitates generation of the first and second card guide base portions from one iteration of a manufacturing process and/or tool.

48. The apparatus of claim 11, wherein the first card guide base portion and the second card guide base portion are attached through a connecting member, wherein the first card guide base portion, the second card guide base portion, and the connecting member comprise an integral formation;
wherein the integral formation facilitates generation of the first and second card guide base portions from one iteration of a manufacturing process and/or tool.

49. The apparatus of claim 11, wherein the card guide end portion comprises one or more recesses to facilitate a keying system.

50. The apparatus of claim 13, wherein the card guide end portion comprises one or more recesses to facilitate a keying system.

51. The apparatus of claim 13, wherein the integral formation facilitates generation of the first and second card guide base portions from one iteration of a manufacturing process and/or tool.

52. The apparatus of claim 20, wherein the card guide end attachment component comprises one or more recesses to facilitate a keying system.

53. The apparatus of claim 20, wherein the integral formation facilitates generation of the first and second preformed card guide base portions from one iteration of a manufacturing process and/or tool.

54. The apparatus of claim 26, wherein the card guide insert comprises one or more recesses to facilitate a keying system.

55. The apparatus of claim 31, wherein the base portion of the card guide path comprises a first card guide base portion and a second card guide base portion attached through a connecting member, wherein the first card guide base portion, the second card guide base portion, and the connecting member comprise an integral formation.

56. The apparatus of claim 31, wherein the end face portion comprises one or more recesses to facilitate a keying system.

57. The method of claim 38, wherein the card guide base portion comprises a first card guide base portion and a second card guide base portion attached through a connecting member, wherein the first card guide base portion, the second card guide base portion, and the connecting member comprise an integral formation.

58. The apparatus of claim 39, wherein the any one of the red colored card guide end face portion and the non-red colored card guide end face portion comprises one or more recesses to facilitate a keying system.

* * * * *

UNITED STATES PATENT AND TRADEMARK OFFICE
CERTIFICATE OF CORRECTION

PATENT NO. : 6,661,673 B2
DATED : December 9, 2002
INVENTOR(S) : Michael Alan Brook et al.

It is certified that error appears in the above-identified patent and that said Letters Patent is hereby corrected as shown below:

Column 7,
Line 43, delete "wit" and insert therefor -- with --
Line 46, after "subpart" insert a comma
Line 47, delete "fUrther" and insert therefor -- further --
Line 52, delete "pat." and insert therefor -- path. --
Line 62, delete "flice" and insert therefor -- face --

Column 8,
Line 8, delete "to" and insert therefor -- the --
Line 51, delete "wit" and insert therefor -- with --

Column 10,
Line 28, delete "the," and insert therefor -- face, --

Column 11,
Line 38, delete "to" and insert therefor -- the --

Column 12,
Line 4, delete "forte" and insert therefor -- for the --
Line 7, delete "firm" and insert therefor -- from --
Line 32, delete "wit" and insert therefor -- with --
Line 63, delete "to" and insert therefor -- the --

Signed and Sealed this

Twenty-second Day of March, 2005

JON W. DUDAS
*Director of the United States Patent and Trademark Office*